United States Patent [19]
Minnick et al.

[11] 4,117,543
[45] Sep. 26, 1978

[54] MAGNETIC BUBBLE LOGIC FAMILY

[75] Inventors: Robert C. Minnick, Houston, Tex.; Paul T. Bailey, Creve Coeur; Robert M. Sandfort, St. Charles, both of Mo.; Warren L. Semon, Dewitt, N.Y.

[73] Assignee: Monsanto Company, St. Louis, Mo.

[21] Appl. No.: 283,267

[22] Filed: Aug. 24, 1972

[51] Int. Cl.² ............................................. G11C 19/08
[52] U.S. Cl. .......................................... 365/5; 365/13; 365/43
[58] Field of Search ............ 340/174 TF; 307/88 LC; 365/5, 13, 16

[56] References Cited
U.S. PATENT DOCUMENTS

| | | | |
|---|---|---|---|
| 3,723,716 | 3/1973 | Bobeck et al. | 340/174 TF |
| 3,743,851 | 7/1973 | Kohara | 365/5 |

*Primary Examiner*—James W. Moffitt
*Attorney, Agent, or Firm*—Lane, Aitken, Dunner & Ziems

[57] ABSTRACT

A set of three input, three output bubble logic gates forms all of the possible distinct output functions for conservative three variable gates. The magnetic interaction between single wall domains propagating through separate channels defined by closely spaced circuit element paths causes the domains to switch to or remain on alternate paths via between-path transfer means in a predetermined fashion. In addition to vertically graded element transfer means, several new circuit arrangements are introduced including non-graded elements, strong and weak S-curves, elements having uneven gradation, and other circuit techniques. A group of primitive realizations are described which can be combined to produce other gates having output functions in each of 31 equivalence classes. A methodology for using the gates in logic design is suggested, and several new building block gates producing functions of two variables are presented.

70 Claims, 43 Drawing Figures

C = CLASS
N = NUMBER OF PERMUTATIONS

FIG. 1.
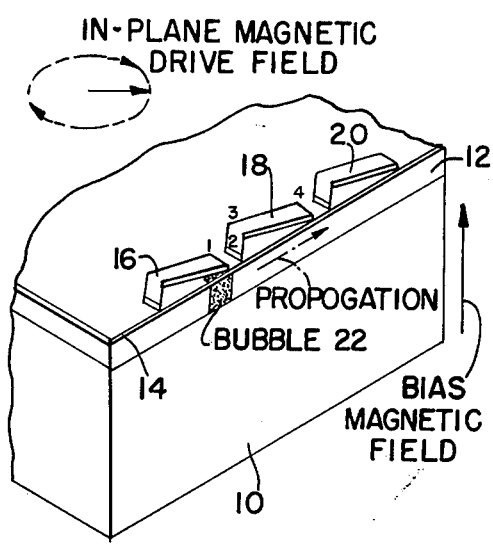
FIG. 2.
FIG. 3.
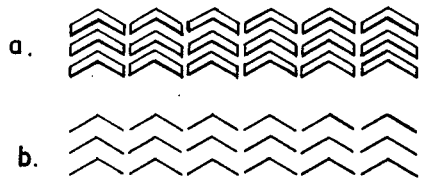
FIG. 4A.
(A) PERMALLOY CIRCUIT ELEMENTS
FIG. 4B.
X ———△——— $F_{8a} = XY$
Y ———————— $F_{8b} = X+Y$
Z ———————— $F_{8c} = Z$
(B) SYMBOLIC CIRCUIT
CLASS 8
FIG. 5A.
FIG. 5B.
X ———△——— $F_{1a} = XY + XZ + YZ = MAJ(X,Y,Z)$
Y ———————— $F_{1b} = XYZ$
Z ———————— $F_{1c} = X+Y+Z$
CLASS I
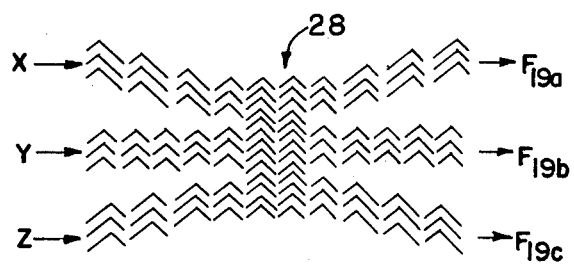
FIG. 6A.
FIG. 6B.
X ———□——— $F_{19a} = X + YZ$
Y ———————— $F_{19b} = Y(X \oplus Z')$
Z ———————— $F_{19c} = Z + XY$
CLASS 19

FIG. 7A.
CLASS 21

$X \rightarrow$ ... $\leftarrow F_{21a}$
$Y \rightarrow$ ... $\leftarrow F_{21b}$
$Z \rightarrow$ ... $\leftarrow F_{21c}$

FIG. 8A.
CLASS 10

$X \rightarrow$ ... $\leftarrow F_{10a}$
$Y \rightarrow$ ... $\leftarrow F_{10b}$
$Z \rightarrow$ ... $\leftarrow F_{10c}$

FIG. 7B.
$\begin{cases} X \\ Y \\ Z \end{cases}$ — $F_{21a} = X + YZ$
$F_{21b} = Y(X+Z')$
$F_{21c} = Z$

FIG. 8B.
$\begin{cases} X \\ Y \\ Z \end{cases}$ — $F_{10a} = X(Y+Z)$
$F_{10b} = X'(Y+Z) + X(Y \oplus Z')$
$F_{10c} = XY + XZ + YZ = MAJ(X,Y,Z)$

FIG. 9.
$X$ — $F_{29a} = XY + XZ + YZ$
$Y$ — $F_{29b} = XY + YZ + XZ'$
$Z$ — $F_{29c} = Z$
CLASS 29

FIG. 10.
$X$ — $F_{25a} = XY + YZ + XZ$
$Y$ — $F_{25b} = X \oplus Y \oplus Z$
$Z$ — $F_{25c} = XY + YZ + XZ$
CLASS 25

FIG. 11.
$X$ — $F_{3a} = X(Y+Z)$
$Y$ — $F_{3b} = YZ$
$Z$ — $F_{3c} = X+Y+Z$
CLASS 3

FIG. 12.
$X$ — $F_{9a} = X(Y+Z)$
$Y$ — $F_{9b} = Y + (X \oplus Z)$
$Z$ — $F_{9c} = Z(X+Y)$
CLASS 9

FIG. 13.
$X$ — $F_{2a} = X+YZ$
$Y$ — $F_{2b} = XYZ$
$Z$ — $F_{2c} = Y+Z$
CLASS 2

FIG. 14.
$X$ — $F_{28a} = XY + XZ + YZ$
$Y$ — $F_{28b} = XYZ + Z'(X \oplus Y)$
$Z$ — $F_{28c} = Z + XY$
CLASS 28

FIG. 15.
$X$ — $F_{17a} = X(Y+Z)$
$Y$ — $F_{17b} = YZ + Z'(X \oplus Y)$
$Z$ — $F_{17c} = Z + XY$
CLASS 17

FIG. 16.
$X$ — $F_{15a} = X(Y+Z)$
$Y$ — $F_{15b} = Y + XZ'$
$Z$ — $F_{15c} = Z$
CLASS 15

FIG. 17.
CLASS (A) ... = ... 15
(B) ... = ... 8
(C) ... = ... 21
(D) ... = ... 29
(E) ... = ... 19
(F) ... = ... 10

*FIG. 18A.*
CLASS 1
*FIG. 20A.*
CLASS 29
*FIG. 20E.*
CLASS 17
*FIG. 18B.*
CLASS 1
*FIG. 20B.*
CLASS 9
*FIG. 20F.*
CLASS 28
*FIG. 19A.*
CLASS 15
*FIG. 20C.*
CLASS 19
*FIG. 20G.*
CLASS 10
*FIG. 19B.*
CLASS 21
*FIG. 20D.*
CLASS 2
*FIG. 20H.*
CLASS 25
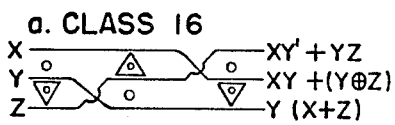
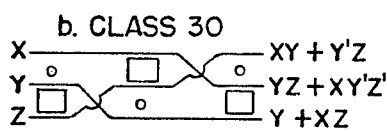
*FIG. 22.*
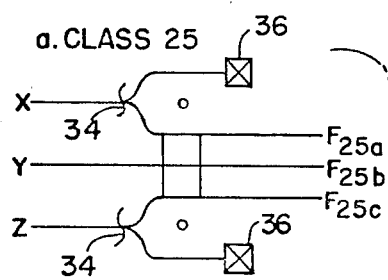
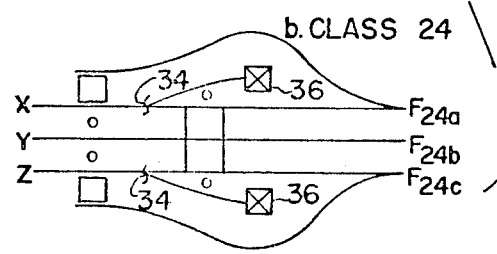
*FIG. 23.*

FIG. 21.

FIG. 24.
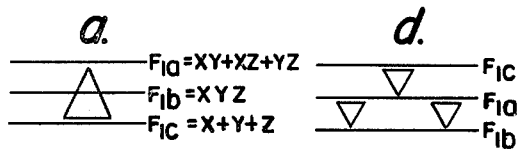
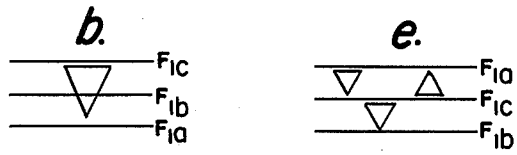
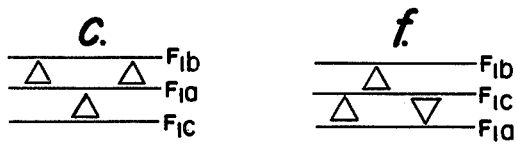
FIG. 25.
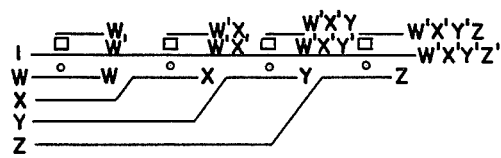
FIG. 26.
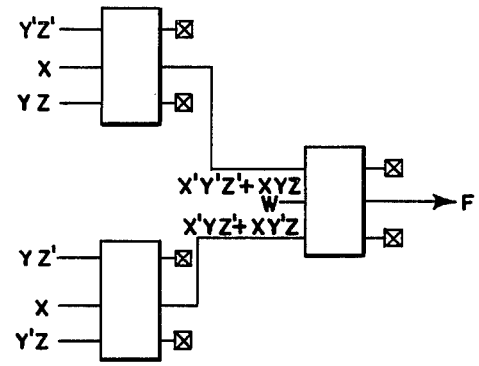
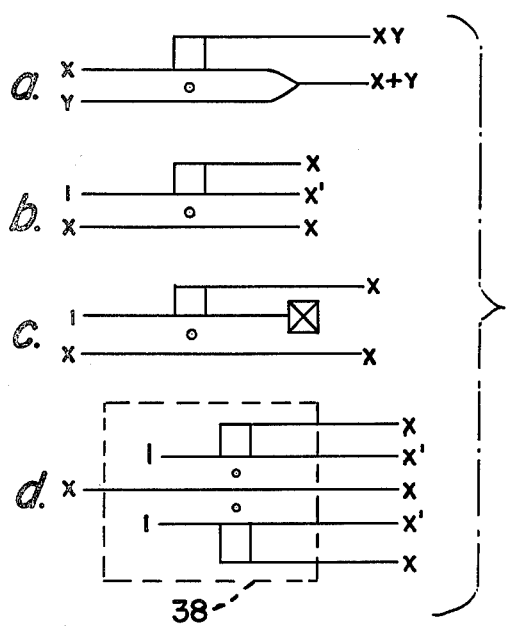
FIG. 27.
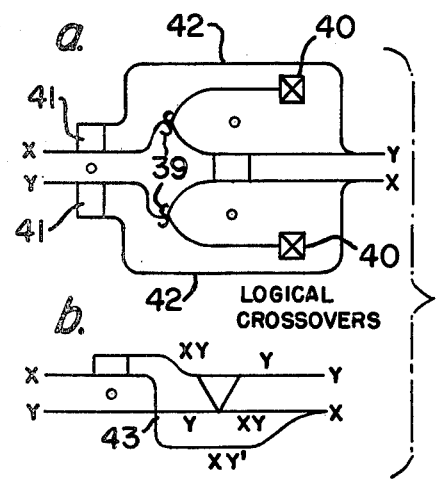
FIG. 28.
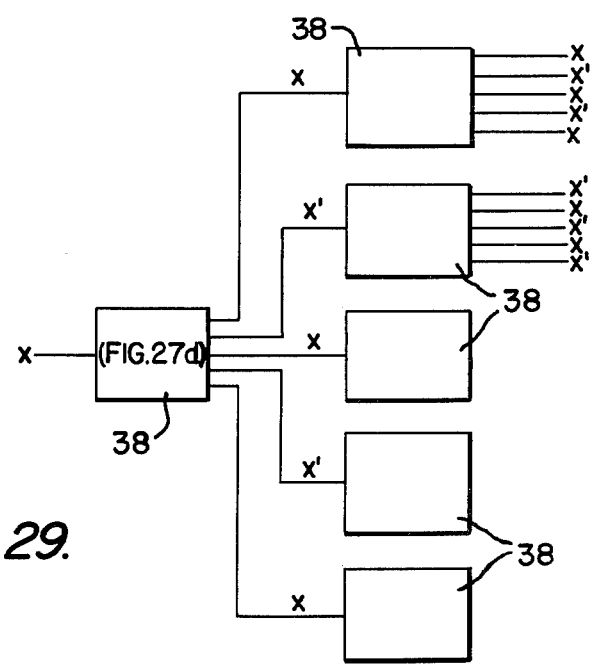
FIG. 29.

MAGNETIC BUBBLE LOGIC FAMILY

BACKGROUND OF THE INVENTION

The invention relates generally to the field of magnetic bubble technology (MBT) and more particularly to logic arrangements utilizing the capabilities of single wall magnetic domain devices.

The continuing evolution of MBT has now reached the point where large scale application to various data processing is practicable. Current interest in MBT is due primarily to the prospect of extremely high bit packing density, low power comsumption and reliability for low cost mass memories.

Briefly, MBT involves the creation and propagation of single wall magnetic domains in specially prepared magnetic materials. The application of a static uniform magnetic bias field orthogonal to a sheet of magnetic material having suitable uniaxial anisotropy causes the normally random serpentine pattern of magnetic domains to contract or shrink into short cylindrical figurations or bubbles whose common polarity is opposite that of the bias field. The bubbles repel each other and can be moved or propagated by a magnetic field in the plane of the sheet.

Many schemes now exist for propagating the bubbles along the sheet in predetermined channels. One propagation system includes permalloy circuit elements shaped like military uniform stripes or "chevrons" spaced end-to-end in a thin layer over the sheet of magnetic material. The drive or propagation field is continuously rotating in the plane of the sheet causing each chevron to act as a small magnet whose poles are constantly changing. As the drive field rotates, a bubble under one of the chevrons is moved along the chevron channel from point to point in accordance with its magnetic attraction to the nearest attracting temporary pole of the circuit elements. This system is among those referred to as "field-access" as distinguished from other systems employing loops of conductors disposed over the magnetic sheet.

The use of MBT in data processing stems from the fact that the bubbles can be propagated through their channels at a precisely determined rate so that uniform data streams of bubbles are possible in which the presence or absence of a bubble indicates a binary 1 or 0. The use of MBT for performing logic operations is based on the fact that close magnetic bubbles tend to repel each other. Thus, if alternate paths with varying degrees of preference are built into the chevron circuit, the direction which a bubble on one channel ultimately takes may be influenced by the presence or absence of a bubble on another closely spaced channel. Logic systems capitalizing on this principle are shown in U.S. Pat. Nos. 3,678,287 and 3,676,871 to Chow and Copeland, respectively. An additional logic "interactor" is shown in the June 1971 issue of Scientific American in an article beginning on page 78 entitled "Magnetic Bubbles" by Bobeck and Scovil. A paper dealing with this topic was also presented at the American Institute of Physics conference proceedings, No. 5, pp. 45-55 (1972), entitled "An Overview of Magnetic Bubble Domains - Material Device Interface" by Bobeck, Fisher and Smith. Another recent article on this topic is "Logic Functions for Magnetic Devices" by Sandfort and Burke, IEEE Trans. Mag., Vol. MAG-7, No. 3, Sept. 1971, pp. 358-360.

Besides the inherent capability of performing logic with magnetic domains, one other aspect of MBT has given impetus to logic development. MBT was originally envisioned as a mass memory but the most difficult problem has been encountered in readout. Optical devices utilizing the Faraday effect and magnetoresistive devices have been used, but are not entirely satisfactory. Therefore, it is important to minimize readout to the extent possible by incorporating logic in the memory so that the magnetic bubbles representing information can be logically manipulated before readout is necessary.

In the above Bobeck, Fisher and Smith article, a single three input, three output (3—3) logic gate was specified (hereafter the Bobeck gate). The gate structure involved the principle of uniformly graded packing density of identical permalloy chevrons between tracks in a direction transverse (vertical) to normal propagation. Structurally, the Bobeck gate utilized three approximately parallel bubble channels formed by chevron tracks interconnected by a vertical section several chevrons long having chevrons extending in columns across all three channels. The vertical spacing between chevrons decreases toward the middle channel. The gate has three inputs to receive three variables X, Y and Z, where each of these variables can represent 0 and 1 (i.e. bubble or no bubble) and three output functions $f_1$, $f_2$, $f_3$ where $f_1 = f_3 = XY + XZ + YZ$ and $f_2 = X \oplus Y \oplus Z$.

SUMMARY OF THE INVENTION

Three-variable gates are particularly useful because they provide building blocks which offer both logic and control, for example, a bubble gate which performs specific logic operations on two bubble data streams with the gate controlled by a third data bubble stream.

While the Bobeck gate is a three-input — three-output gate, one of the outputs is redundant. The gate is thus capable of producing only two different logic functions. The present invention provides a set of 27 classes of three-input — three-output gates with each output from a gate of any given class in the set providing a different logic function than the other two outputs from the gate. The set of 27 classes provide 18 different functions of two or more of the input variable X, Y and Z. Thus, the present invention provides the logic designer with a large repertory of functions from which he can select to achieve a simplified ultimate logic design. With the gates of the present invention, the logic designer is equipped to design computing circuits and data processing circuits of the highest degree of complexity.

In the development which follows, all of the possible 3—3 bubble logic gate functions are determined, their relative importance in logic design is described, simple realizations for embodiments of each one are presented, and a methodology for constructing complex logic functions is explained. In addition, several new types of interaction circuits are described.

In determining the complete set of all possible output functions for three variable bubble logic gates, all of the necessary and useful logic functions of three variables have been made available. At least one realization or implementation for each of the gates has been realized. The result is a whole family of three variable MBT logic gates.

Taking into account the principle of "bubble conservation", there are 729 "distinct" 3—3 circuits. This number reduces to 122 unique circuits when the order of the output functions is disregarded. Ordering these circuits in accordance with permutations of the three inputs in each, results in 31 "equivalence classes". Of these 31 classes, one class is trivial and comprises merely three bubble channels which do not interact, one class is the Bobeck gate discussed above and produces a redundant output; a third class is really a two-input — two output gate described in the Sandfort and Burke article mentioned above with a third channel which does not coact with the other two channels; a fourth class is realized by the gate described in the Chow U.S. Pat. No. 3,678,287 which gate produces functions of two or more of the input variables on only two of its outputs and annihilates the bubbles in the third output. The set of remaining 27 classes are provided by the present invention.

After removing all of the functions from the 31 classes which are the same by some permutation of the variables, the equivalence classes can be grouped according to their production of 20 distinct logic functions containing many logical combinations of one, two and three variables.

In the process of implementing each possible gate, several new types of bubble channel interaction mechanisms have also been developed. The Bobeck gate utilizes "graded element field" in which the spacing of chevrons between the bubble tracks becomes smaller towards the middle track. Other useful interaction mechanisms include a non-graded, packed circuit element bridge between two or more tracks; transfer paths between the middle and the top and bottom tracks in which the element spacing increases or decreases away from the middle track at different rates; a transfer field from the top track to the bottom track in which the packing density varies uniformly becoming more dense toward the bottom track; merging channels; diverging channels called strong and weak S-curves with which a bubble can switchover from one track to another in the presence os absence of a bubble in another track; packing circuit elements of different widths instead of different spacings; intersections of two channels at which bubbles arrive simultaneously or never simultaneously. Various combinations of these techniques are described in arriving at realizations for the predicted 3—3 circuit set. In addition, several new closely related building block gates producing simple functions of two variables are presented.

BRIEF DESCRIPTION OF THE DRAWINGS

FIG. 1 is a block diagram illustrating generalized 3—3 conservative logic circuit;

FIG. 2 is a fragmentary perspective view of a bubble channel;

FIG. 3A is a plan view of a chevron bubble track showing the chevron pattern;

FIG. 3B is an example of a graphic shorthand illustration of the pattern shown in FIG. 3A;

FIGS. 4A-8A are schematic drawings illustrating graphic for primitive realizations of Classes 8, 1, 19, 21 and 10;

FIGS. 4B-8B are symbolic representations for the gates illustrated in FIGS. 4A-8A, respectively.

FIGS. 9-16 are schematic drawings illustrating primitive realizations in symbolic form for Classes 29, 25, 3, 9, 2, 28, 17 and 15;

FIG. 17, consisting of A-F is a schematic drawing illustrating the equality between various forms of S-curves and the general symbols for circuit interactions of various types;

FIGS. 18A-20H are plan views illustrating realizations of Classes 1, 15, 21, 29, 9, 14, 2, 17, 28, 10 and 25, respectively, using chevrons of different widths;

FIG. 21 is a chart showing in symbolic form a realization for each of the 31 classes of 3-3 logic bubble logic conservative circuits not shown in FIGS. 4-16;

FIG. 22 is a schematic drawing illustrating alternatives for Classes 16 and 30;

FIG. 23 illustrates alternative non-conservative circuit realizations for Classes 24 and 25;

FIG. 24 consisting of A-F is a schematic drawing illustrating symbolicaly realizations for all six circuits in equivalence Class 1;

FIG. 25 is a schematic drawing illustrating an arbitrary fan-in NOR circuit;

FIG. 26 is a schematic drawing illustrating the use of Shannon decomposition function for logical design;

FIGS. 27 and 28 are schematic drawings illustrating in symbolic form miscellaneous closely related bubble logic gates;

FIG. 29 illustrates in symbolic form logical crossovers.

DESCRIPTION OF THE PREFERRED EMBODIMENT

The following description is not restricted in application to any particular type of MBT device. It is not restricted to MBT garnet materials or any other specific type of material in which magnetic bubbles can be maintained and moved, nor is the description limited to magnetic domains of a specified size and shape. In fact, the word "bubble" used through this text is intended to encompass any single-walled magnetic domain, defined as a domain having an outer boundary which closes on itself. The manner of bubble propagation is an important factor in the implementation and the performance of the logic circuits described below. However, this disclosure is not limited of necessity to chevron circuit elements nor even to field accessed circuit elements, although it is recognized that it is a decided advantage to utilize individual circuit elements which pack very closely like chevrons. Since the logic capability of MBT is due primarily to bubble-bubble repulsion, in contrast to pure memory capabilities which rely solely on the presence and absence of bubbles, the disclosure is limited to schemes in which bubble propagation paths come close enough at some point that the bubbles in two or more paths exert a useful magnetic influence on each other.

The following development has been divided for convenience into two sections, one discussing the mathematical determinacy of 3—3gates and the other discussing practical realizations of logic gates and their use in logic design.

I. Determination of the Size and Class of 3—3 Logic Gates and Identification of Each of its Members Magnetic bubbles may be created with a device termed a generator, destroyed with an annihilator and split into two bubbles with a splitter. Circuits that do not create or destroy bubbles and are memory free are termed "conservative". In accordance with the principle of bubble conservation, a general three-variable memory-free conservative logical circuit must have the three outputs shown in FIG. 1. In this circuit X, Y and Z represent the inputs, while $F_a$, $F_b$, and $F_c$ are the outputs. Each input may be one bubble or no bubble to represent binary values 1 and 0. In the following truth table (Table I) for the circuit of FIG. 1, the top and bottom rows are strictly determined by the principle of bubble conservation.

TABLE I

| X | Y | Z | $F_a$ | $F_b$ | $F_c$ | |
|---|---|---|---|---|---|---|
| 0 | 0 | 0 | 0 | 0 | 0 | |
| 0 | 0 | 1 | | | | |
| 0 | 1 | 0 | | | | |
| 0 | 1 | 1 | | | | THREE CHOICES FOR EACH ROW |
| 1 | 0 | 0 | | | | |
| 1 | 0 | 1 | | | | |
| 1 | 1 | 0 | | | | |
| 1 | 1 | 1 | 1 | 1 | 1 | |

That is, if no bubbles go into the circuit no bubbles will come out, and if three bubbles go into the circuit one bubble must come out at each output. For the remaining six rows there are three possible combinations which conserve bubbles. Since each of these six rows can be chosen independently of the others, there are $3^6 = 729$ distinct 3-3 circuits. The set of 729 circuits has three special members for which two of the outputs are identical logic functions. Each of three special members therefore has only two distinct outputs. For all the remaining circuits, the three outputs are different logic functions. Accordingly, 726 sets represents six permutations of each one of 121 sets of three distinct functions, while the remaining three circuits represent the three permutations of one function having only two distinct members. Thus, the elimination of permutations of duplicate logic functions reduces the number of circuits from 729 to 726/6 +3/3 = 122 circuits. Many of these 122 circuits transform into each other by permutations of the inputs X, Y and Z and thus are equivalents. It is convenient to list these circuits in "equivalence classes". There are 31 such classes. In Table II below, all 31 of the unique output trios of functions are listed.

Column C indicates the class number and the Column P indicates the number of possible distinct permutations of these circuits based on permutations of the inputs. It will be noted in Table II that Class 25, which is realized by the Bobeck gate, has two redundant outputs, Class 23 is the trivial class, and Class 8 is realized by a two-input - two-output gate such as proposed by Sandfort and Burke in the article mentioned above with a third channel which does not coact with the other two channels. The gate disclosed in the Chow U.S. Pat. No. 3,678,287, is in Class 29 with one output annihilated to make three-input - two-output gate. The remaining 27 classes are provided by the present invention. It can be observed from Table II that 64 different individual logic functions are produced. After removing those functions which are the same by some permutation of the variables, the functions listed in the following Table III result.

TABLE II
SET OF 3-VARIABLE BUBBLE GATES WITH CONSERVATION

| C | P | | FUNCTIONS | |
|---|---|---|---|---|
| 1 | 1 | X Y Z | XY + XZ + YZ | X + Y + Z |
| 2 | 3 | X Y Z | X + YZ | Y + Z |
| 3 | 3 | X Y | Z (X + Y) | X + Y + Z |
| 4 | 3 | X Y | XY + XZ + YZ | Z + (Z ⊕ Y) |
| 5 | 6 | X Y | XY' + YZ | Y + Z |
| 6 | 6 | X Y | X + YZ | Z + X' Y |
| 7 | 3 | X Y | X (Y' + Z) + X' Y | Z + XY |
| 8 | 3 | X Y | X + Y | Z |
| 9 | 3 | X (Y + Z) | Y (X + Z) | Z + (X ⊕ Y) |
| 10 | 3 | X (Y + Z) | XY + XZ + YZ | Z (X' + Y) + Z' (X⊕Y) |
| 11 | 3 | X (Y + Z) | YZ + X (Y ⊕ Z') | Y + Z |
| 12 | 6 | X (Y + Z) | YZ + XZ' | Z + X' Y |
| 13 | 3 | X (Y + Z) | X + YZ | YZ + X' (Y + Z) |
| 14 | 6 | X (Y + Z) | Y (X' + Z) | X + Z |
| 15 | 6 | X (Y + Z) | Y | Z + XY' |
| 16 | 6 | X (Y + Z) | XZ + X' Y | X' Z + X (Y + Z') |
| 17 | 6 | X (Y + Z) | Y + XZ | X' Z + X (Y ⊕ Z') |
| 18 | 3 | X (Y ⊕ Z') | XY + XZ + YZ | Y + Z |
| 19 | 3 | X (Y ⊕ Z') | Y + XZ | Z + XY |
| 20 | 6 | X (Y + Z') | XZ + X' Y | Z + XY |
| 21 | 6 | X (Y + Z') | Y + XZ | Z |
| 22 | 6 | X (Y + Z') | XY + XZ + YZ | Z + X' Y |
| 23 | 1 | X | Y | Z |
| 24 | 3 | X | XZ + X' Y | XY + X' Z |
| 25 | 1 | XY + XZ + YZ | XY + XZ + YZ | ⊕ Y ⊕ Z |
| 26 | 3 | XY + XZ + YZ | YZ + XY' Z' | YZ' + Z (X + Y') |
| 27 | 6 | XY + XZ + YZ | YZ + XZ' | XZ + X' (Y ⊕ Z) |
| 28 | 3 | XY + XZ + YZ | X + YZ | XYZ + X' (Y ⊕ Z) |
| 29 | 3 | X | XY + XZ + YZ | YZ + X' (Y + Z) |
| 30 | 6 | YZ + XY' Z' | XZ + YZ' | Z + XY |
| 31 | 2 | YZ + XZ' | XZ + X' Y | XY + Y' Z |

Total 122 Different Gates

TABLE III

| ROW | EQUIVALENCE CLASSES | | | | | | LOGIC FUNCTION |
|---|---|---|---|---|---|---|---|
| 1 | 8 | 15 | 21 | 23 | 24 | 29 | X |
| 2 | 3 | 4 | 5 | 6 | 7 | 8 | XY |
| 3 | 2 | 5 | 8 | 11 | 14 | 18 | X+Y |
| 4 | 1 | 2 | | | | | XYZ |
| 5 | 1 | 3 | | | | | X+Y+Z |
| 6 | 2 | 6 | 7 | 13 | 17 | 19 | 20 21 28 30 X+YZ |
| 7 | 6 | 12 | 15 | 22 | | | X+YZ' |
| 8 | 3 | 9 | 10 | 11 | 12 | 13 | 14 15 16 17 X(Y+Z) |
| 9 | 14 | 20 | 21 | 22 | | | X(Y+Z') |
| 10 | 5 | 12 | 16 | 20 | 24 | 27 | 30 31 YZ+XZ' |
| 11 | 1 | 4 | 10 | 18 | 22 | 25 | 26 27 28 29 XY+XZ+YZ |
| 12 | 13 | 29 | | | | | XY+XZ'+YZ' |
| 13 | 11 | 26 | 30 | | | | YZ+XY'Z' |
| 14 | 18 | 19 | | | | | X(Y⊕Z') |

TABLE III-continued

| ROW | EQUIVALENCE CLASSES | | | LOGIC FUNCTION |
|---|---|---|---|---|
| 15 | 4 | 9 | | $X+(Y\oplus Z)$ |
| 16 | 7 | 16 | 26 | $XZ+(X\oplus Y)$ |
| 17 | 25 | | | $X\oplus Y\oplus Z$ |
| 18 | 10 | | | $XY+(X\oplus Y\oplus Z)$ |
| 19 | 17 | 27 | | $XZ+Z'(X\oplus Y)$ |
| 20 | 28 | | | $XYZ+Z'(X\oplus Y)$ |

Table III, which shows all of the possible functions that can be produced using the 3—3 circuits, displays the large logic potentiality of these circuits. Rows 2-5 of the table are the two and three variables AND's and OR's. Row 7, with $X=0$ and $Y=1$, is convenient NOT. Row 10 is recognized as the Shannon decomposition from which one can create any logic function. Rows 11 and 12 are majority functions, and row 17 is the odd parity function.

II. 3-3 Circuit Realizations

FIG. 2 illustrates the basic components of a fieldaccessed garnet bubble chip. A substrate 10 of non-magnetic garnet supports an epitaxial magnetic bubble garnet layer 12 and a spacing layer 14 of silicon oxide, SiO$_2$, to which these permalloy chevron circuit elements 16, 18 and 20 are bonded. The chip is subjected to a magnetic field orthogonal to the plane of the bubble garnet layer 12. In the presence of a bias field of suitable strength a cylindrical bubble 22 is maintained in the bubble garnet layer 12. A rotating in-plane magnetic drive field causes the bubble 22 to propagate along the track defined by the chevron circuit elements 16, 18 and 20 which are spaced from each other in alignment end-to-end. The bubble 22 behaves as if it were a mobile vertical bar magnet with a polarization opposite to that of the bias field. When the rotating drive is oriented as shown in FIG. 2, the bubble seeks an energy minimum under pole 1 of chevron 16. As the drive field is uniformly rotated clockwise through one period, 360°, the bubble 22 moves through positions 2 and 3 to position 4 on the next chevron 18. Thus, the length of each chevron corresponds to one complete cycle of the drive field. For this reason, the bubble 22 is propagated along the propagation track in a completely determinate fashion.

For the purpose of guarding against defects in the garnet bubble material as well as in the permalloy chevrons themselves, the chevrons may be packed as shown in FIG. 3A to form a multielement propagation track. In the absence of other magnetic influences, a bubble will be propagated to the right as viewed in FIG. 3 down the middle of the track. In FIG. 3B, a symbology for representing the individual chevrons is illustrated, wherein single lines or hash marks represent each individual chevron.

Among the 729 3—3 conservative circuits there is a subset termed primitive realizations which form building blocks for the remainder of the set. In the primitive realizations for 3—3 circuits in FIGS. 4-16, bubbles are propagated on tracks of circuit elements similar to those shown in FIG. 3; the presence of a single bubble will represent a binary 1 and its absence will represent a 0. It is assumed that the track lengths are adjusted, such as by using compressors, so that the three signals for the inputs X, Y and Z arrive simultaneously at the circuit and are maintained as simultaneous signals all the way through the circuit.

An example of one kind of packed field of circuit elements is shown in FIG. 4A. Three distinct bubble tracks are formed with chevrons. Each track consists of three parallel lines of chevrons having an input and an output function end. In the function trio $F_{8a}$, $F_{8b}$ and $F_{8c}$ or equivalence Class 8, the Z variable is contained only in one function, $F_{8c} = Z$. Therefore, one track in FIG. 4A, arbitrarily the bottom track, can be spaced far enough away from the other two so that no operable interaction occurs. Thus, the lower track of FIG. 4A propagates the Z input straight through to the $F_{8c}$ output. The top two bubble tracks for the inputs X and Y are interconnected by a graded element field 24 forming a bridge between the two tracks. The field 24 stretches vertically across the two tracks perpendicular to the ordinary direction of bubble propagation. The field of chevrons is constructed such that the vertical spacing between chevrons is less at the bottom than at the top. That is the spacing decreases toward the middle track forming a density gradient. All of the chevrons are approximately the same width and size unless otherwise specified. If a single bubble enters the X track from the left, it will tend to drift downward in search of an energy minimum via the element field 24. Because the chevrons act as tiny magnets under the influence of the rotating drive field, the bubble will tend to be attracted to the area where the chevrons are most concentrated, provided that a suitable path for propagation to that area exists. Thus, the X bubble switches to the middle or Y track via the element field 24 and exits at the middle output $F_{8b}$. On the other hand, a single bubble which enters the middle or Y-track has no tendency to drift upward. If bubbles enter simultaneously on the X and Y tracks of FIG. 4, the bubble-bubble repulsion keeps both bubbles on their tracks and as a result the X and Y bubbles exit on the top and middle outputs $F_{8a}$ and $F_{8b}$. Thus, the top output $F_{8a}$ receives a bubble only if there were bubbles at the X and Y inputs simultaneously. $F_{8a}$ represents and AND function. Similarly, the middle track produces the OR functions since a bubble will appear at the middle output when either X or Y or both inputs are bubbles.

In FIG. 4A, the element field 24 is shown as two cycles wide. That is, the field's two chevron width is traversed in two cycles of the rotating drive field. In practice this width may be larger. The element field 24 is shown as packed identical chevrons but any other circuit elements which pack conveniently are satisfactory for these realizations.

A symbolic circuit for the primitive realization of FIG. 4A is shown in FIG. 4B with the logic function outputs. In this symolism, bubble tracks are shown by solid lines and unless otherwise stated, bubbles move from the left to the right. The graded element field is represented by a triangle, which is intended to suggest that the circuit element density is greatest at the base or, in this case, toward the middle track.

In FIG. 5A, a primitive realization is shown for circuits in equivalence Class 1. In this case, a graded field 26 bridges all three bubble tracks. The vertical spacing of the chevrons decreases toward the Z track. Any single input bubble drops to the bottom track through the graded element field 26. Any two bubbles repel one another and exit on the upper and lower tracks, while three simultaneous input bubbles exit on all three tracks. The logic functions produced as well as the symbolic circuit for this primitive realization is shown in FIG. 5B. The realization of Class 1 alternatively could be a graded field of circuit elements changing from light density to heavy density going from the top track to the middle track and changing from the same light density to heavy density going from the middle track to the bottom track. This realization might be represented symbolically by two single height triangles, one above the other with their bases downward.

In FIG. 6A, a primitive realization for Class 19 employs a vertically uniform zero-gradient or non-graded element field 28 bridging the three tracks symbolized in FIG. 6B by a rectangle to suggest the lack of gradation in the element field. This important field arrangement is further distinguished from the graded fields by the fact that the transfer field is not a preferred path in the absence of bubble-to-bubble interactions. Any two simultaneous input bubbles separate via the bridging element field and exit on the upper and lower tracks. The middle output function $F_{19b}$ receives a bubble when the only input bubble is on the Y track or when three tracks have simultaneous input bubbles. It should be noted that the function $Y (X \oplus Z')$ is identical to $XYZ + X' Y Z'$.

Another primitive realization which uses the principle of a non-graded element field is shown in FIG. 7 as representative of Class 21. Here a uniform element field 30 bridges the top and middle tracks. The bottom track is brought close enough to the middle track for bubble repulsion to be effective; however, there is no transfer field bridging the middle and bottom tracks and, consequently, there can be no bubble interchange with the bottom track. The small circle in FIG. 7B between the middle and bottom tracks of the symbolic circuit of FIG. 7A indicates both the effective repulsion and the lack of a bridging field. A bubble entering the middle track will remain on that track unless a bubble is simultaneously present on the lower track. In all other cases bubbles enter and exit on the same tracks. The packing of the circuit elements in the non-graded field between the top and middle tracks is the same or only slightly less than the vertical spacing on the tracks themselves.

In FIG. 8A, a complex graded element field 32 bridges all three tracks. The density of the chevrons is unbalanced with respect to the middle or Y track. The bridging field increases in density going from both the top and bottom tracks toward the Y track, but the density increases at a greater rate going from the top or X track to the Y track than from the bottom or Z track toward the Y track so that the density of circuit elements approaching the Y track from the X track is greater than approaching the Y track from the Z track. In FIG. 8B the greater density of the graded field between the top and middle tracks is indicated by the presence of a circle in the triangle. The element field between the top and middle tracks in this figure has sufficient density that a bubble on the Y track is not repelled strongly enough by a simultaneous bubble on the Z track to overcome this element field gradient. Thus, the Y bubble remains on the middle track. If two bubbles enter simultaneously on the top and bottom tracks, they also exit on those tracks. Similarly, a single bubble on either the X or Z tracks takes the preferred route to the Y track exit. An X or Y bubble will prevent a Z bubble from switching to the middle exit.

Several other primitive realizations may be composed by combining the kinds of element fields illustrated in FIGS. 4-8. The more important realizations are shown in symbolic form in FIGS. 9-16.

There are other ways to achieve the primitive realizations, and two of these, the principles of the strong and weak S-curves are illustrated symbolically in FIG. 17. Just as two multielement tracks can be made to merge into one, so one track 20B be made to diverge into two. Packing of the elements at the point of divergence can be made such that a bubble progressing past the divergence point will always chose one track (the preferred track), unless externally influenced by another bubble to choose the other track (the less preferred track). The preferred track will be the track having the greater density. FIG. 17A represents a strong S-curve: a bubble entering the top track will always choose this S-curve unless influenced not to do so by a simultaneous bubble on the middle track or on the bottom track. FIG. 17C represents a weak S-curve: a bubble entering the middle track will always stay on that track, and will not choose this S-curve unless influenced to do so by a simultaneous bubble on the bottom track. The strong and weak S-curves can be crossed as shown in FIGS. 17D and 17F. The S-curve symbolism is used because the actual circuit realizations for the S-curve contains certain tracks which are in the shape of S-curves. Hence, the S-curve symbols are considered to be specific, while the symbols introduced in FIGS. 4-16 are adopted as general; each of the latter symbols represents any realization (field accessed or otherwise) which produces the logical effect that the given general symbol defines. The relationship of the specific (S-curve) symbols to the general symbols (triangles, rectangles, and circled triangles) is indicated in FIG. 17. The general symbols used throughout the rest of this disclosure may be realized in practice either by vertical transfer fields or by true S-curve tracks. The density of the circuit elements can be increased by increasing the vertical width of the circuit elements instead of increasing their number and decreasing the spacing therebetween. In FIG. 18A, the two-story triangle realization of Class 1 shown in FIG. 5B circuits is obtained by using a graded element field in which the width of the chevrons increases toward the bottom track.

The strength of an S-curve is determined by the packing density on the S-curve relative to the packing density on the track from which the S-curve diverges. In practice, this may be implementd by varying the vertical spacing between the elements or by using chevrons of different widths as shown in the complex S-curve realization for Class 1 in FIG. 18B. In FIG. 18B, a strong S-curve going from the top track through the middle track to the bottom track crosses a weak S-curve going from the middle track to the top track. FIGS. 19A and 19B illustrate S-curve varying width realizations for Classes 15 and 21, respectively, symbolized in FIGS. 17A and 17C, respectively. Thus, FIG. 19A shows a strong S-curve and FIG. 19B shows a weak S-curve.

FIG. 20 illustrates an S-curve realization of Class 29 symbolically shown in FIG. 17D and thus shows a strong S-curve going from the top track to the middle track crossing a weak S-curve going from the middle track to the top track. FIGS. 20D through 20H illustrate S-curve realizations for Classes 9, 19, 2, 17, 28, 10 and 25, respectively. FIG. 20B shows two strong S-curves converging toward the middle track from the two outside tracks. FIG. 20C is illustrated symbolically in FIG. 17E. FIG. 20D shows a weak and a strong S-curve diverging from the middle track to the top and bottom tracks, respectively. FIG. 20E shows a strong S-curve going from the top to middle track and a weak S-curve going from the middle to bottom track. FIG. 20F shows a weak S-curve going from the middle track to the top track and a strong S-curve going from the bottom track to the middle track crossing a weak S-curve going from the middle track to the bottom track. FIG. 20G is symbolically illustrated in FIG. 17F. FIG. 20H shows strong S-curves converging on the middle track crossing weak S-curves diverging from the middle track.

The primitive realizations of FIGS. 4-16 can be combined by cascading them, merging tracks, crossing tracks, and other techniques to produce realizations for all of the remaining circuits of the 729 possible gates. A tabulation of these circuits is presented in symbolic form in FIG. 21. Each realization in FIG. 21, as well as those shown in FIGS. 4-16, corresponds to one input permutation and one output permutation in each class. In order to find a realization not in FIGS. 4-16 or FIG. 21, the inputs of one of the illustrated realizations can be relabeled. For example, one of the 17 permutations of Class 2 not shown is FIG. 21 can be obtained by relabeling the top and middle bubble tracks so that the input order is Y, X, Z instead of X, Y, Z. The resulting outputs change to Y + XZ, XYZ and X + Z. It is interesting to note, however, that in Class 1 (FIG. 5) no permutation of the inputs has any effect on the output functions. The five permutations of the Class 1 circuits not shown in FIG. 5 therefore represent output permutations which can be realized by crossovers and other techniques explained below.

The realizations in FIG. 21 for Classes 16 and 31 deserve special mention. In the Class 16 realization, two Class 21 primitive realizations (FIG. 7) are placed such that they mutually influence one another. In the Class 31 realization, a Class 21 primitive realization is influenced by two adjacent tracks rather than one. Both influencing tracks in the Class 31 realization cannot have bubbles simultaneously, and so these tracks can be quite close together. Alternatively, double influence of a Class 21 primitive realization can be obtained by arranging the packing of circuit elements comprising the outside track so that the bubble on the track, and its range of influence are larger than normal. Bubbles are enlarged along a bubble track where the track widens, that is, where the number or widths of chevrons in adjacent columns increases for several cycles.

Crossovers in FIG. 21 are of two types: in one type, for example in Class 6, the crossover point can be simultaneously (that is during one period of the drive field) approached by a bubble on each track; and in the other type the crossover point is never simultaneously approached by a bubble on each track. The former is symbolized by a jumpered crossing of lines, the latter with a simple crossing of lines as in one of the crossings of realizations for Classes 30 and 31, respectively. By designing the gate so that the latter type crossovers can be used, a simpler structure of the crossover is permitted and the reliability of the crossover is improved. Crossovers are described in the Morrow et al U.S. Pat. No. 3,543,255. A simultaneous logical crossover realization is described below with reference to FIG. 29.

It should be observed in connection with FIG. 21 that frequenty two bubble tracks are merged into one. Because of bubble conservation, it is essential that the point where the tracks are joined not be approached simultaneously by a bubble on each track. This property is guaranteed in all cases where merging is used in FIG. 21.

FIG. 22 illustrates improvements of the realizations for Classes 16 and 30. Both display an interesting symmetry. The improved realization for Class 16 uses three mutually inverted cascaded Class 15 primitive realizations (see FIG. 16). Similarly, the improved realization for Class 30 uses three mutually inverted cascaded Class 21 primitive realizations (see FIG. 7). It is also interesting to compare the improved realization of Class 16 and 30 in FIG. 22 with the realizations for Classes 12 and 20 in FIG. 21.

FIG. 23 (A and B) shows realizations for Classes 24 and 25 using non-conservative circuits. Both of these circuits employ bubble splitters 34 and bubble annihilators 36 shown in symbolic form. A bubble splitter 34 receiving one bubble causes two bubbles to emerge on diverging tracks. A bubble annihilator 36 causes the entering bubble to disappear. Both bubble splitters and annihilators are known in the prior art. Instead of a bubble splitter, a bubble multiplier may be used as described below with reference to FIG. 27. In FIG. 23A, the tracks are spaced so that bubbles are repelled only to an immediately adjacent track.

Permuting the imputs in all of these realizations is obviously easy to accomplish by relabeling the tracks. But, performing the output permutations is obviously more difficult and may actually require in some cases intertwined crossings of the output lines to reorder the output functions. In many cases it is possible to find realizations which minimize the number of crossovers. To illustrate, FIG. 24 shows realizations of all six circuits (output permutations) in equivalence Class 1; none of these requires a crossover.

The set of primitive realizations for 3—3 bubble circuits is sufficiently rich that alternative realizations can be found for most of the circuits in FIGS. 4-16 and 21. For instance, 80 alternative realizations for the Class 25 (Bobeck) circuit of FIG. 21 are listed in Table IV below.

TABLE IV

| C | P | C | P |
|---|---|---|---|
| 1 | 9 | 2 | 10 |
| 1 | 10 | 4 | 10 |
| 1 | 15 | 2 | 15 |
| 1 | 17 | 2 | 17 |
| 1 | 28 | 2 | 17 |
| 1 | 29 | 2 | 17 |
| 2 | 9 | 2 | 19 |
| 2 | 10 | 4 | 19 |
| 3 | 10 | 2 | 21 |
| 3 | 17 | 2 | 28 |
| 3 | 28 | 2 | 28 |
| 8 | 10 | 2 | 28 |
| 8 | 28 | 2 | 28 |
| 9 | 19 | 1 | 28 |
| 9 | 28 | 2 | 28 |
| 10 | 10 | 2 | 29 |
| 10 | 17 | 2 | 29 |
| 10 | 19 | 2 | 29 |
| 10 | 21 | 2 | TOTAL |

| C | P |
|---|---|
| 28 | 4 |
| 29 | 2 |
| 28 | 2 |
| 10 | 2 |
| 17 | 2 |
| 28 | 2 |
| 9 | 1 |
| 10 | 2 |
| 10 | 2 |
| 9 | 2 |
| 10 | 4 |
| 15 | 2 |
| 17 | 2 |
| 28 | 2 |
| 29 | 2 |
| 10 | 2 |
| 28 | 2 |
| 29 | 2 |
| 80 | |

C = CLASSES
P = PERMUTATIONS

These 80 alternatives use various pairings of circuits for Classes 1, 2, 3, 8, 9, 10, 15, 17, 19, 21, 28 and 29. In Table IV, the columns labeled C are the classes which are cascaded and the columns labeled P are the permutations of each pair of cascaded classes. It should be noted that pairing Class 25 circuits always yields a Class 25 circuit. Cascading is a general technique for realizing other circuits within the set. The result of a cascade of any two or more realizations of classes is always a member of the set of 31 classes. Cascades of two or three of the following simple gates, Classes 1, 5, 8, 9, 10, 19, 21, 25 and 29, yield the additional Classes 2, 3, 4, 7, 11, 18 and 28. As another example, using Classes 13, 24, and 31 only, one can realize all 31 members of the entire set via cascades. Using cascades of only Classes 8, 21, and 15 and crossovers, one can realize all but Classes 24 and 31.

Logic design may be accomplished using these 3-3 circuits in many ways. For instance, one might "specialize" one or more circuits by connecting an input track to a bubble generator (a logic 1) or to nothing (a logic 0). The resulting outputs for such a circuit are functions of 1 or 2 variables, and it is well known that there are just non-trivial functions of one or two variables X and Y. When the circuits represented in FIGS. 4–16 and 21 are specialized by connecting 0 or 1 to one of the inputs, certain of the possible one and two variable functions are produced as indicated in Table V below.

except Classes 1, 2, 3, 8 and 23 and except for the Bobeck gate, Class 25, are in this category. Class 25 can be used alone, but it must be specialized in two ways rather than one. That is, every singly complete class except the Bobeck gate, Class 25, contains a single function which is universal by itself. This disadvantage of the Bobeck gate can be easily proved by attempting to find one output function which by inserting the 0's or 1's or both as inputs produces the NOT function as well as either the AND or OR functions.

All of the NIMP specializations in the above table are formed by connecting one inputs to "0", while the IMP specializations are formed by connecting one input to a "1". Because connection to a "0" corresponds to no connection, while connection to a "1" corresponds to a generator, those classes which specialize to the NIMP are of particular interest, and among these Classes 15, 17, 19, 21, 28 and 29 are singled out because of their simple realizations. Using Class 21 for illustration, a circuit for a four variable NOR is shown in FIG. 25. An arbitrary fan-in NOR can be constructed in this cascade fashion using only one generator. The additional outputs in the circuit may be used elsewhere or annihilated. Given the ability to synthesize arbitrary fan-in NOR's, the problem of logic design with these modules becomes relatively straightforward.

Other features of the 3—3 circuits illustrate the rich-

TABLE V

| CLASS | NOT | OR | AND | NIMP | IMP | EXOR | IDEN | NAND | NOR |
|---|---|---|---|---|---|---|---|---|---|
| 1 |  | x | x |  |  |  |  |  |  |
| 2 |  | x | x |  |  |  |  |  |  |
| 3 |  | x | x |  |  |  |  |  |  |
| 4 | x | x | x |  | x | x |  |  |  |
| 5 | x | x | x | x | x |  |  |  |  |
| 6 | x | x | x | x | x |  |  |  |  |
| 7 | x | x | x |  | x | x |  |  |  |
| 8 |  | x | x |  |  |  |  |  |  |
| 9 | x | x | x |  | x | x |  |  |  |
| 10 | x | x | x |  | x | x | x |  |  |
| 11 | x | x | x | x |  | x |  |  |  |
| 12 | x | x | x | x | x |  |  |  |  |
| 13 | x | x | x | x | x |  |  |  |  |
| 14 | x | x | x | x | x |  |  |  |  |
| 15 | x | x | x | x | x |  |  |  |  |
| 16 | x | x | x | x | x | x |  |  |  |
| 17 | x | x | x | x | x | x | x |  |  |
| 18 | x | x | x | x |  |  | x |  |  |
| 19 | x | x | x | x |  |  | x |  |  |
| 20 | x | x | x | x | x |  |  |  |  |
| 21 | x | x | x | x | x |  |  |  |  |
| 22 | x | x | x | x | x |  |  |  |  |
| 23 |  |  |  |  |  |  |  |  |  |
| 24 | x | x | x | x | x |  |  |  |  |
| 25 | x | x | x |  |  | x | x |  |  |
| 26 | x | x | x | x | x | x | x |  |  |
| 27 | x | x | x | x | x | x | x |  |  |
| 28 | x | x | x | x |  | x | x |  |  |
| 29 | x | x | x | x | x |  |  |  |  |
| 30 | x | x | x | x | x |  | x |  |  |
| 31 | x | x | x | x | x |  |  |  |  |

From this table, it is seen that only the NAND and NOR are not produced.

Further examination of Table V shows that one can use any single one of the 31 3—3 circuits for all necessary logic, except for Classes 1, 2, 3, 8 and 23, because each of these circuits forms a complete basis for synthesizing any logical function. The excepted classes share the common defect of not producing the NOT function. Furthermore, any circuit in the above table which can be specialized to realize either of the two variable NIMP (XY′ or X′Y) or IMP (X+Y′ or X′+Y) functions can be used just in that one specialization alone to synthesize arbitrary logic, since these two functions are "singly complete", that is they can be used to produce NOT and either AND or OR functions. All circuits ness of the logic functions in this set. For example, Class 1 outputs AND, OR and a Majority of three variables. Classes 13 and 29 produce a controlled crossover of AND/OR. For example, in Class 29 when $Z = 0$, the outputs are XY, X+Y and "0". However, when $Z = 1$, the outputs are X+Y, XY, and "1". Class 24 allows a controlled crossover or controlled permutation as follows: when $Z = 0$, the outputs are X, "0" and Y; when $Z = 1$, the outputs are Y, "1" and X. Class 21 provides a controlled AND/OR function as follows: when $Z = 0$, the outputs are X, Y and "0"; when $Z = 1$, the outputs change to XY, X+Y and "1".

The Shannon decomposition function, which is listed as row 10 of Table III is useful in a logic design. Among the eight equivalence classes (5, 12, 16, 20, 24, 27 and 31) which produce this function, the realizations given in FIG. 21 for Classes 5 and 20 are attractive. Between these two, the auxiliary functions, AND and OR, produced make Class 5 the most natural choice as a 3—3 circuit to use for the Shannon decomposition. The logic designer can structure a tree of Class 5 circuits; and he can continue this tree until all variables have been decomposed.

To illustrate this form of logic design, the four variable switching function $F = W'X'Y'Z' + W'XYZ + WX'YZ' + WXY'Z$ is decomposed on the variables W and X, using the Class 5 circuit tree shown in FIG. 26. The four decomposition products Y'Z', XZ', YZ' and YZ that are shown in FIG. 26 are producible by methods that have been described above.

Still another logic design method takes fuller advantage of the variety of switching functions available in the 3—3 circuits of FIGS. 4-16 and 21. The designer makes reference to Table III to locate logic functions that might constitute portions of the functions he wishes to produce. Using those figures, he is able to locate the one or several 3—3 circuits in FIGS. 4-16 and 21 which produce the desired functions.

A set of extremely valuable functions XY, XY' and Y is produced by setting to "0" one input in certain 3—3 circuits. All of the circuits which produce XY, XY' and Y as an output set are specified in Table VI below.

TABLE VI

| CLASS | SET TO ZERO |
|---|---|
| 5 | Z |
| 6 | Y |
| 11 | X or Y |
| 12 | X or Y |
| 13 | X or Y |
| 14 | X |
| 15 | Y |
| 16 | Z |
| 17 | Y |
| 18 | X or Y |
| 19 | X or Z |
| 20 | X or Z |
| 21 | X |
| 22 | X or Z |
| 24 | X or Z |
| 26 | X or Y |
| 27 | Y or Z |
| 28 | X or Y |
| 29 | X or Y |
| 30 | X, Y or Z |
| 31 | X, Y or Z |

Miscellaneous Closely Related Gates (FIGS. 27-29)

FIG. 27 shows four useful gates composed of the primitive realization for Class 21 (FIG. 7). By setting the top track input to zero and joining the middle and bottom output tracks in the Class 21 primitive realization, an OR gate and an AND gate is constructed as shown in FIG. 27A. Setting the top track to zero and the middle track to one by using a generator for the input to the middle track, a bubble multiplier is obtained as shown in FIGS. 27B and C. The inverted output on the middle track can be used or annihilated. The bubble multiplier may be used in place of a bubble splitter. A five-output bubble multiplier built upon the circuit of FIG. 27C is shown in FIG. 27D. The module 38 in FIG. 27D includes the two generators.

FIG. 28 illustrates how the five-output module 38 of FIG. 27D can be used to form a multiplication tree. It can be shown that after N stages $(5^N + 1)/2$ are produced from one input track.

FIGS. 29A and 29B illustrate a pair of logical crossovers. The logical crossover of FIG. 29A can be used in the realizations in FIG. 21 to avoid physical crossovers of two bubbles which simultaneously approach a crossover point. Thus, the actual intersection of two data streams is avoided. In FIG. 29A, each bubble on an input track is split into two bubbles by one of the bubble splitters 39. The split bubbles on the outer tracks from the splitters 39 are eliminated by bubble annihilators 40. When two bubbles enter the X and Y inputs simultaneously they repel each other through ungraded element fields 41 to the outermost tracks 42, which join the inner tracks leading from the splitters 39. The use of the ungraded element fields 41 and the outermost tracks 42 prevent two simultaneous bubbles at the bubble splitters 39 and improve the reliability of the crossover circuit. In FIG. 29B, the crossover is achieved with bubble conservation and no generators, splitters, or annihilators are required. It will be noted that the crossover circuit in FIG. 29B itself employs a crossover 43. However, the crossover 43 is never approached by two simultaneous bubbles and thus the use of the circuit of 29B improves the reliability of the crossover.

The term conservative circuit with a specified number of outputs and a specified number of inputs does not exclude the use of these circuits with generators and annihilators. The term conservative is intended to apply only to the gate circuitry itself. The specification of the number of outputs does not mean that all of the outputs will be utilized as some may be connected to annihilators. Similarly, the specification of the number of input channels does not mean that the input is connected to receive a binary variable as it may be connected to a bubble generator or it may be connected to nothing to represent a connection, for example, to binary zero such as in FIG. 25A.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

We claim:

1. A conservative field accessed magnetic bubble logic circuit comprising means defining at least three input channels for transmitting magnetic bubbles, means defining at least three output channels for receiving and transmitting magnetic bubbles, and control means responsive to the combination of the presences and absences of bubbles received simultaneously on said three input channels to produce a presence or absence of a bubble on each of said output channels in accordance with a °differentl logic function of X, Y and Z wherin X, Y and Z are binary variables represented by the presences or absences of bubbles received on said three input channels, respectively, the logic function for each output channel being different than the logic function for each one of the remaining output channels, each of said logic functions containing at least two of said variables, means to apply a cyclical propagating magnetic field to said means defining said input channels, said output channels and said control means to cause bubbles applied to said input channels to be transmitted through said control means to said output channels, said control means conserving bubbles and producing the same number of bubbles simultaneously on said output channels that appear simultaneously on said input channels, the bubbles being produced on said output channels a fixed number of cycles of said propagating magnetic field after the bubbles appear in said input channels.

2. A conservative magnetic bubble logic circuit as recited in claim 1 wherein the logic function for at least one of said three output channels is XYZ.

3. A conservative magnetic bubble logic circuit as recited in claim 1 wherein the logic function for at least one of said three output channels is $X+Y+Z$.

4. A magnetic bubble logic circuit as recited in claim 1 wherein a first of logic functions is $XY+XZ+YZ$, a second of said logic functions is XYZ and a third of said logic functions is $X+Y+Z$.

5. A logical crossover circuit comprising means defining first and second input channels for receiving and transmitting magnetic bubbles, means defining first and second output channels for receiving and transmitting magnetic bubbles, means for transmitting a bubble from said first input channel to said first output channel in response to a simultaneous bubble on said second input channel and to said second output channel in response to the absence of a simultaneous bubble on said second input channel, and means to transmit a bubble from said second input channel to said first output channel in response to the absence of a simultaneous bubble on said first input channel and to said second output channel in response to a simultaneous bubble on said first input channel.

6. A conservative magnetic bubble logic circuit comprising means defining at least three input channels for transmitting magnetic bubbles, means defining at least three output channels for receiving and transmitting magnetic bubbles, control means responsive to the combination of presences and absences of bubbles received on said three input channels to produce a presence or absence of a bubble on at least one of said output channels in accordance with the logic function $X+YZ$, wherein X, Y and Z are binary variables represented by the presences or absences of bubbles on said three input channels, respectively, said control means conserving bubbles and producing the same number of bubbles in said output channels that are received on said input channels.

7. A conservative magnetic bubble logic circuit as recited in claim 6 wherein said control means produces a presence or absence of a bubble on a second of said output channels in accordance with the logic function $Y(X+Y')$.

8. A conservative magnetic bubble logic circuit comprising means defining at least three input channels for transmitting magnetic bubbles, means defining at least three output channels for receiving and transmitting magnetic bubbles, control means responsive to the combination of presences and absences of bubbles received on said three input channels to produce a presence or absence of a bubble on at least one of said output channels in accordance with the logic function $X+YZ'$, wherein X, Y and Z are binary variables represented by the presences or absences of bubbles on said three input channels, respectively, said control means conserving bubbles and producing the same number of bubbles in said output channels that are received on said input channels.

9. A conservative magnetic bubble logic circuit as recited in claim 8 wherein said control means produces a presence or absence of a bubble on a second of said output channels in accordance with the logic function $X(Y+Z)$.

10. A conservative magnetic bubble logic circuit comprising means defining at least three input channels for transmitting magnetic bubbles, means defining at least three output channels for receiving and transmitting magnetic bubbles, control means responsive to the combination of presences and absences of bubbles received on said three input channels to produce a presence or absence of a bubble on at least one of said output channels in accordance with the logic function $X(Y+Z)$, wherein X, Y and Z are binary variables represented by the presences or absences of bubbles on said three input channels, respectively, said control means conserving bubbles and producing the same number of bubbles in said output channels that are received on said input channels.

11. A conservative magnetic bubble logic circuit comprising means defining at least three input channels for transmitting magnetic bubbles, means defining at least three output channels for receiving and transmitting magnetic bubbles, control means responsive to the combination of presences and absences of bubbles received on said three input channels to produce a presence or absence of a bubble on at least one of said output channels in accordance with the logic function $X(Y+Z')$, wherein X, Y and Z are binary variables represented by the presences or absences of bubbles on said three input channels, respectively, said control means conserving bubbles and producing the same number of bubbles in said output channels that are received on said input channels.

12. A conservative magnetic bubble logic circuit comprising means defining at least three input channels for transmitting magnetic bubbles, means defining at least three output channels for receiving and transmitting magnetic bubbles, control means responsive to the combination of presences and absences of bubbles received on said three input channels to produce a presence or absence of a bubble on at least one of said output channels in accordance with the logic function $XY+Y'Z$, wherein X, Y and Z are binary variables represented by the presences or absences of bubbles on said three input channels, respectively, said control means conserving bubbles and producing the same number of bubbles in said output channels that are received on said input channels.

13. A conservative magnetic bubble logic circuit as recited in claim 12 wherein said control means produces a presence or absence of a bubble on a second of said output channels in accordance with the logic function $XY'+YZ$.

14. A magnetic bubble logic circuit comprising means defining at least three bubble channels comprising first, second and third adjacent tracks of magnetic circuit elements, and a bridging pattern of magnetic circuit elements bridging said three tracks comprising means to transmit magnetic bubbles from said second track to said first track only if repelled by a simultaneous bubble in said third track to transmit a bubble from said second track to said third track only if repelled by a simultaneous bubble in said first track and to cause a bubble in said first track or in said third track to remain in said first or third track, respectively.

15. A conservative magnetic bubble logic circuit comprising means defining at least three bubble channels for transmitting magnetic bubbles comprising first, second and third adjacent tracks of magnetic circuit elements, a pattern of circuit elements bridging between said first and second tracks comprising means to cause a bubble on said first track to remain on said first track and to transmit a bubble from said second track to said first track only if repelled by a simultaneous bubble on said third track, said third track being sufficiently close to said first and second tracks at said bridging pattern so that a bubble in said third track will repel a simultaneous bubble in said second track to said first track through said bridging pattern, said second and third tracks defining a bubble transmission gap between said second and third tracks so that a bubble in said second track cannot be transferred to said third track at said bridging pattern.

16. A conservative magnetic bubble logic circuit comprising means defining at least three bubble channels for transmitting magnetic bubbles comprising first, second and third adjacent tracks of magnetic circuit elements, a first bridging pattern of magnetic circuit elements bridging between said first and second tracks comprising means to transmit a bubble from said first track to said second track unless repelled by a simultaneous bubble in said second track or said third track and to transmit a bubble from said second track to said first track only if repelled by a simultaneous bubble in said third track and a second bridging pattern of circuit elements bridging between said second track and said third track comprising means to cause a bubble in said third track to remain in said third track and to transmit a bubble from said second track to said third track only if repelled by a simultaneous bubble in said first track, said first, second and third tracks being sufficiently close together at said bridging patterns that simultaneous bubbles repel each other.

17. A conservative magnetic bubble logic circuit comprising means defining at least three bubble channels for transmitting magnetic bubbles comprising first, second and third adjacent tracks of magnetic circuit elements, and a bridging pattern of circuit elements bridging between said first, second and third tracks comprising means to transmit a bubble from said first track or said second track to said third track unless repelled by a simultaneous bubble on said second or third tracks and to transmit a bubble from said second track to said first track only if repelled by a simultaneous bubble on said third track, said first, second and third tracks being sufficiently close to each other at said bridging pattern so that simultaneous bubbles at said bridging pattern repel each other.

18. A conservative magnetic bubble logic circuit comprising means defining at least three bubble channels for transmitting magnetic bubbles comprising first, second and third adjacent tracks of magnetic circuit elements, a first bridging pattern of circuit elements bridging between said first and second tracks comprising means to transmit a bubble from said second track to said first track only if repelled by a simultaneous bubble on said third track and causing a bubble on said first track to remain on said first track, a second bridging pattern of circuit elements bridging between said second track and said third track comprising means to transmit any bubble occurring on said second track to said third track unless repelled by a simultaneous bubble on said third track.

19. A conservative magnetic bubble logic circuit comprising means defining three bubble channels for transmitting magnetic bubbles comprising first, second and third adjacent tracks of magnetic circuit elements, a bridging pattern of magnetic circuit elements bridging between said first and second tracks, said bridging pattern comprising means to transmit bubbles only from said first track to said second track and to cause a bubble to be transmitted from said first track to said second track unless such bubble is repelled by a simultaneous bubble on either said second or said third track, said first, second, and third tracks being sufficiently close to each other at said bridging pattern so that simultaneous bubbles at said bridging pattern repel each other.

20. A conservative magnetic bubble logic circuit as recited in claim 19 wherein a second bridging pattern of magnetic circuit elements is provided between said second and third tracks adjacent to said first mentioned bridging pattern between said first and second tracks, said second bridging pattern comprising means to transmit bubbles between said second and third tracks.

21. A conservative magnetic bubble logic circuit as recited in claim 20 wherein said second bridging pattern comprises means to cause magnetic bubbles to transfer from said second track to said third track if not repelled by a simultaneous bubble in said third track.

22. A conservative magnetic bubble logic circuit as recited in claim 20 wherein said second bridging pattern comprises means to cause a bubble in said third track to transfer to said second track if not repelled by a simultaneous bubble in said second track or in said first track.

23. A magnetic bubble circuit as recited in claim 22 wherein said second bridging pattern comprises means to prevent transmission of bubbles from said second track to said third track when repelled by a simultaneous bubble in said first track.

24. A conservative magnetic bubble logic circuit comprising means defining at least two bubble channels for transmitting magnetic bubbles comprising first and second adjacent tracks of magnetic circuit elements and means to cause magnetic bubbles to be transmitted along said tracks in a predetermined direction; and a pattern of magnetic circuit elements defining a bridging track diverging from said first track and joining said second track at a point downstream in the direction of bubble transmission through said tracks from the point of divergence from said first track whereby bubbles can be transmitted by said bridging track only from said first track to said second track, said first and second tracks being sufficiently close to one another at said point of divergence so that simultaneous bubbles in said first and second tracks repel each other.

25. A conservative magnetic bubble logic circuit as recited in claim 24 wherein there is provided means defining a third bubble channel for transmitting magnetic bubbles comprising a third track of magnetic circuit elements adjacent to said first and second tracks and sufficiently close to said first track at said point of divergence so that a bubble in said first track at said point of divergence will be repelled by a bubble in said third track.

26. A magnetic bubble logic circuit as recited in claim 24 wherein the density of the circuit elements in said bridging track and said first track are adjusted immediately downstream from said point of divergence to cause the bubble to be transmitted in a preferred one of said bridging track and said first track absent the repulsion effect of a simultaneous bubble in an adjacent track.

27. A conservative magnetic bubble logic circuit comprising means defining three magnetic bubble channels for transmission of magnetic bubbles comprising first, second and third tracks of magnetic circuit elements, means to cause bubbles to be transmitted along said tracks in a predetermined direction, and a bridging pattern of bridging circuit elements extending between said first and second tracks comprising means to transmit bubbles from said first track to said second track and from said second track to said first track, said bridging pattern including a bridging track of circuit elements diverging from said first track and joining said second track at a point downstream in the direction of bubble transmission through said tracks from the point of divergence from said first track, the circuit elements of said bridging track being of greater density than the remaining circuit elements in said bridging pattern and of greater density than the circuit elements of said first track immediately downstream from said point of divergence, said first, second and third tracks being sufficiently close to one another at said point of divergence so that simultaneous bubbles in said tracks repel one another.

28. A conservative magnetic bubble logic circuit comprising means defining a plurality of input channels for receiving and transmitting magnetic bubbles, means defining a plurality of output channels for receiving and transmitting magnetic bubbles, control means responsive to the combination of presences and absences on said input channels to produce a presence or absence on each of said output channels in accordance with a predetermined logic function, the logic functions for at least two of said output channels being different and being dependent upon the presences and absences of bubbles in at least two of said input channels, said control means including a plurality of channels for transmitting bubbles interconnecting said input channels with output channels including a junction where two of said channels join together into a single channel, said control means conserving bubbles and being designed so that two bubbles never arrive at said junction simultaneously for any combination of presences and absences of bubbles applied to said plurality of input channels.

29. A conservative magnetic bubble logic circuit comprising means defining a plurality of input channels for receiving and transmitting magnetic bubbles, means defining a plurality of output channels for receiving and transmitting magnetic bubbles, control means responsive to the combination of presences and absences on said input channels to produce a presence or absence of a bubble in each of said output channels in accordance with a predetermined logic function, the logic functions for at least two of said output channels being different and depending upon the combination of presences and absences of bubbles on at least two of said input channels, said control means comprising a plurality of bubble transmission channels interconnecting said input channels with said output channels for the transmission of magnetic bubbles from said input channels to said output channels, a pair of said bubble transmission channels crossing each other at a crossover point, and bridging means for the transmission of bubbles between said bubble transmission channels upstream and downstream of said crossover point relative to the direction of bubble transmission through said bubble transmission channels.

30. A conservative magnetic bubble logic circuit comprising means defining a plurality of input channels for receiving and transmitting magnetic bubbles, means defining a plurality of output channels for receiving and transmitting magnetic bubbles, and control means responsive to the combination of presences and absences of said magnetic bubbles on said input channels to produce a presence or absence of a bubble in each of said output channels in accordance with a predetermined logic function, the logic functions for at least two of said output channels depending upon the combination of presences and absences of bubbles on at least two of said input channels, said control means including a plurality of bubble transmission channels for transmitting bubbles from said input channels to said output channels, a pair of said bubble transmission channels crossing over each other at a crossover point, said control means conserving bubbles and being designed and adapted to that two magnetic bubbles never approach said crossover point simultaneously.

31. A conservative magnetic bubble logic circuit comprising a first three-input — three-output magnetic bubble gate, a second three-input — three-output magnetic bubble gate, said first and second three-input-three-output gates each comprising means defining at least three input channels for receiving and transmitting magnetic bubbles, means defining at least three output channels for receiving and transmitting magnetic bubbles, and control means responsive to the combination of presences and absences on said three input channels to produce a presence or absence of a bubble on each of said output channels in accordance with a different logic function of X, Y and Z wherein X, Y and Z are binary variables represented by the presences or absences of bubbles on said three input channels, respectively, each of said binary variables being in at least two of the three different logic functions for said three output channels, said control means conserving bubbles and producing the same number of bubbles on said output channels that appear on said input channels; and connecting means severally connecting the three output channels of said first gate to the three input channels of said second gate.

32. A conservative magnetic bubble logic circuit as recited in claim 31, wherein said connecting means include magnetic bubble channels and a crossover where said bubble channels interconnecting the output channels of said first gate with the input channels of said second gate cross one another.

33. A conservative magnetic bubble logic circuit comprising first, second and third identical three-input-three-output magnetic bubble gates, each of said gates having first, second and third input channels for receiving and transmitting magnetic bubbles, first, second and third output channels for receiving and transmitting magnetic bubbles, and means responsive to the combination of presenses or absences of magnetic bubbles on said input channels to produce presences and absences of magnetic bubbles on each of said output channels in accordance with a different function of X, Y and Z wherein X, Y and Z are represented by the presences or absences of bubbles in said first, second and third channels respectively; first connecting means connecting the output channels of said first gate to the input channels of said second gate, and second connecting means connecting the output channels of said second gate with the input channels of said third gate.

34. A conservative logic circuit as recited in claim 33 wherein the logic function for the first output of each of said gates is $X(Y+Z)$, the logic function for the second output of each of said gates is $Y+XZ'$, and the logic function for the third output of each of said gates is Z, said first and second connecting means connecting the first output channel to the second input channel, the second output channel to the third input channel and the third output channel to the first input channel.

35. A conservative magnetic bubble logic circuit as recited in claim 33 wherein the function for said first output of said gates is X+YZ, the function for the second output of said gates is Y(X+Z'), and the function for the third output of said gates is Z, said first and second connecting means connecting the first output channel to the second input channel, the second output channel to the third input channel, and the third output channel to the first input channel.

36. A conservative magnetic bubble logic circuit comprising means defining three bubble channels for transmitting magnetic bubbles comprising first, second and third adjacent tracks of magnetic circuit elements, a pattern of magnetic circuit elements bridging between said first and second tracks of magnetic elements adapted to transmit a magnetic bubble from said second track to said first track only if repelled by a simultaneous bubble in said third track, said third track being sufficiently close to said second track for a bubble therein to exert repulsion on a simultaneous bubble in said second track at said bridging pattern, said second and third tracks joining together into a single track downstream from said bridging pattern.

37. A conservative magnetic bubble logic circuit comprising means defining three output channels for receiving and transmitting magnetic bubbles, means defining two input channels for receiving and transmitting magnetic bubbles and control means responsive to the combination of presences and absences of bubbles received on said two input channels to produce a presence or absence of a bubble on one of said output channels in accordance with the logic function XY' wherein X and Y are binary variables represented by the presences or absences of bubbles received on said two input channels, respectively, said control means conserving bubbles and producing the same number of bubbles on said output channels that appear on said input channels.

38. A magnetic bubble logic circuit comprising means defining at least two input channels for receiving and transmitting magnetic bubbles, means defining at least one output channel for receiving and transmitting magnetic bubbles, control means responsive to the combination of presences and absences of bubbles on said input channels to produce a presence or absence of a bubble on said output channel in accordance with the logic function X+Y' whererin X and Y are binary variables represented respectively by the presence or absence of a bubble on said two input channels.

39. A magnetic bubble logic circuit as recited in claim 38 further comprising means defining a third input channel and bubble generating means for applying a bubble to said third input channel each time said binary variables are applied to the first mentioned two of said input channels.

40. A switching device for magnetic bubble domains propagated in a layer of material, the switching device comprising a magnetizable overlay pattern having:
  first and second main channels each having an input position and an output position;
  first and second interconnecting channels connected between the respective input positions and opposite output positions of the main channels; and
  a control channel having interaction positions adjacent each of the input positions, the control channel being substantially parallel to the input channels at said interaction positions;
  the device arranged that a domain at an input position of either of the main channels will be deflected into the respective interconnecting channel by the simultaneous occurrence of a domain at the adjacent interaction position in the control channel, the number of propagation steps from either input positions to either output positions equal in all circumstances.

41. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function for each output channel being different than the logic function for each one of the remaining output channels, each of said logic functions containing at least two of said variables, the logic function for one of said output channels being YZ+XY'Z', said control means conserving bubbles and producing the same number of bubbles on said output channels that appear on said input channels.

42. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function of each output channels being different than the logic function for each one of the remaining output channels, each of said logic functions containing at least two of said variables, the logic function for one of said output channels being X(Y⊕Z'), said control means conserving bubbles and producing the same number of bubbles on said output channels that appear on said input channels.

43. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function of each output channel being different than the logic function for each one of the remaining output channels, each of said logic functions containing at least two of said variables, the logic function for one of said output channels being X+(Y⊕Z), said control means conserving bubbles and producing the same number of bubbles on said output channels that appear on said input channels.

44. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function of each output channel being different than the logic function for each one of the remaining output channels, each of said logic functions containing at least two of said variables, the logic function for one of said output channels being $XZ+(X \oplus Y)$, said control means conserving bubbles and producing the same number of bubbles on said output channels that appear on said input channels.

45. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function of each output channel being different than the logic function for each one of the remaining output channels, each of said logic functions containing at least two of said variables, the logic function for one of said output channels being $XY+(X \oplus Y \oplus Z)$, said control means conserving bubbles and producing the same number of bubbles on said output channels that appear on said input channels.

46. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received simultaneously on said three input channels to produce a presence or absence of a bubble on each of said output channels in accordance with a logic function of X, Y and Z wherein X, Y and Z are binary variables represented by the presences or absences of bubbles received on said three input channels, respectively, the logic function of each output chanel being different than the logic function for each one of the remaining output channels, each of said logic functions containing at least two of said variables, the logic function for one of said output channels being $XZ+Z'(X \oplus Y)$, said control means conserving bubbles and producing the same number of bubbles on said output channels that appear on said input channels.

47. A conservative magnetic bubble logic circuit comprising means defining at least three input channels for transmitting magnetic bubbles, means defining at least three output channels for receiving and transmitting magnetic bubbles, and control mans responsive to the combination of presences and absences of bubbles received simultaneously on said three input channels to produce a presence or absences of a bubble on each of said output channels in accordance with a logic function of X, Y and Z wherein X, Y and Z are binary variables represented by the presences or absences of bubbles received on said three input channels, respectively, the logic function of each output channel being different than the logic function for each one of the remaining output channels, each of said logic functions containing at least two of said variables, the logic function for one of said output channels being $XYZ+Z'(X \oplus Y)$, said control means conserving bubbles and producing the same number of bubbles on said output channels that appear on said input channels.

48. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $X+YZ$, a second of said logic functions being $XYZ$, and a third of said logic functions being $Y+Z$, said control means conserving bubbles and producing the same number of bubbles on said output channels that appear on said input channels.

49. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $X(Y+Z)$, a second of said logic functions being $YZ$, and a third of said logic functions $X+Y+Z$, said control means conserving bubbles and producing the same number of bubbles on said output channels that appear on said input channels.

50. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence of absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY$, a second of said logic functions being $Z+(X \oplus Y)$, and a third of said logic functions being $XY+XZ+YZ$, said control means conserving bubbles and producing the same number of bubbles on said output channels that appear on said input channels.

51. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence of absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being XY, a second of said logic functions being XY′YZ, and a third of said logic functions being Y+Z, said control means conserving bubbles and producing the same number of bubbles on said output channels that appear on said input channels.

52. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being Y+X′Z, a second of said logic functions being XY, and a third of said logic functions being X+YZ, said control means conserving bubbles and producing the same number of bubbles on said output channels that appear on said input channels.

53. A conservative magnetic bubbles logic circuit comprising means defining at least three input channels for transmitting magnetic bubbles, means defining at least three outut channels for receiving and transmitting magnetic bubbles, and control means responsive to the combination of presences and absences of bubbles received on said three input channels to produce a presence of absence of a bubble on each of said output channels in accordance with a different logic function of X, Y and Z wherein X, Y and Z are binary variables represented by the presences of absences of bubbles received on said three input channels, respectively, each of said logic functions containing at least two of said variables, a first of said logic functions being XY, a second of said logic functions being XZ+(X⊕Y), and a third of said logic functions being Z+XY, said control means conserving bubbles and producing the same number of bubbles on said output channels that appear on said input channels.

54. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherrein X, Y and Z are binary variables represented by the presences or absences of bubbles received on said three input channels, respectively, each of said logic functions containing at least two of said variables, a first of said logic functions being X(Y+Z), a second of said logic functions being Y+(X⊕Z), and a third of said logic functions being Z(X+Y), said control means conserving bubbles and producing the same number of bubbles on said output channels that appear on said input channels.

55. A conservative magnetic bubble logic circuit comprising means defining at least three input channels for transmitting magnetic bubbles, means defining at least three output channels for receiving and transmitting magnetic bubbles, and control means resppnsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being X(Y+Z), a second of said logic functions being X′(Y+Z)+X(Y⊕Z′), and a third of said logic functions being XY+XZ+YZ, said control means conserving bubbles and producing the same number of bubbles on said output channels that appear on said input channels.

56. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, y and Z wherein X, Y and Z are binary variables represented by the presences or absences of bubbles received on said three input channels, respectively, each of said logic functions containing at least two of said variables, a first of said logic functions being X+Y, a second of said logic functions being XY+X′Y′Z, and a third of said logic functions being Z(X+Y), said control means conserving bubbles and producing the same number of bubbles on said output channels that appear on said input channels.

57. A conservative magnetic bubble logic circuit comprising means defining at least three input channels for transmitting magnetic bubbles, means defining at least three output channels for receiving and transmitting magnetic bubbles, and conrol means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being Y+XZ′, a second of said logic functions being XY+Y′Z, and a third of said logic functions being Z(X+Y), said control means conserving bubbles and producing the same number of bubbles on said output channels that appear on said input channels.

58. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY+XZ'YZ'$, a second of said logic functions being $Z(X+Y)$, and a third of said logic functions being $Z+XY$, said control means conserving bubbles and producing the same number of bubbles on said output channels that appear on said input channels.

59. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $Y(X+Z')$, a second of said logic functions being $Z(X+Y)$, and a third of said logic functions being $X+Z$, said control means conserving bubbles and producing the same number of bubbles on said output channels that appear on said input channels.

60. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY'+YZ$, a second of said logic functions being $XY+(Y\oplus Z)$, and a third of said logic functions being $Y(X+Z)$, said control means conserving bubbles and producing the same number of bubbles on said output channels that appear on said input channels.

61. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $X(Y+Z)$, a second of said logic functions being $YZ+Z'(X\oplus Y)$, and a third of said logic functions being $Z+XY$, said control means conserving bubbles and producing the same number of bubbles on said output channels that appear on said input channels.

62. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $X+Y$, a second of said logic functions being $Z(X\oplus Y')$, and a third of said logic functions being $XY+XZ+YZ$, said control means conserving bubbles and producing the same number of bubbles on said output channels that appear on said input channels.

63. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $X+YZ$, a second of said logic functions being $Y(X\oplus Z')$, and a third of said logic functions being $Z+XY$, said control means conserving bubbles and producing the same number of bubbles on said output channels that appear on said input channels.

64. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $Y(X+Z')$, a second of said logic functions being $XY'+YZ$, and a third of said logic functions being $Z+XY$, said control means conserving bubbles and producing the same number of bubbles on said output channels that appear on said input channels.

65. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $Y(X+Z')$, a second of said logic functions being $Z+XY'$, and a third of said logic functions being $XY+XZ+YZ$, said control means conserving bubbles and producing the same number of bubbles on said output channels that appear on said input channels.

66. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XZ+(X\oplus Y)$, a second of said logic functions being $XY+X'Y'Z$, and a third of said logic functions being $XY+XZ+YZ$, said control means conserving bubbles and producing the same number of bubbles on said output channels that appear on said input channels.

67. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY+XZ+YZ$, a second of said logic functions being $XY+X'(Y\oplus Z)$, and a third of said logic functions being $XY'+YZ$, said control means conserving bubbles and producing the same number of bubbles on said output channels that appear on said input channels.

68. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY+XZ+YZ$, a second of said logic functions being $XYZ+Z'(X\oplus Y)$, and a third of said logic functions being $Z+XY$, said control means conserving bubbles and producing the same number of bubbles on said output channels that appear on said input channels.

69. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY+Y'Z$, a second of said logic functions being $YZ+XY'Z'$, and a third of said logic functions being $Y+XZ$, said control means conserving bubbles and producing the same number of bubbles on said output channels that appear on said input channels.

70. A conservative magnetic bubble logic circuit comprising means defining at least three input channels for transmitting magnetic bubbles, means defining at least three output channels for receiving and transmitting magnetic bubbles, and control means responsive to the combination of presences and absences of bubbles received on said three input channels to produce a presence or absence of a bubble on each of said output channels in accordance with a different logic function of X, Y and Z wherein X, Y and Z are binary variables represented by the presences or absences of bubbles received on said three input channels, respectively, each of said logic functions containing at least two of said variables, a first of said logic functions being $XY+X'Z$, a second of said logic functions being $XY'+YZ$, and a third of said logic functions being $XZ+YZ'$, said control means conserving bubbles and producing the same number of bubbles on said output channels that appear on said input channels.

* * * * *